United States Patent [19]
Wang

[11] Patent Number: 5,359,573
[45] Date of Patent: Oct. 25, 1994

[54] FLASH E²PROM ARRAY WITH MINGLE POLYSILICON LAYER MEMORY CELL

[75] Inventor: Patrick C. Wang, Cupertino, Calif.

[73] Assignee: Lattice Semiconductor Corporation, Hillsboro, Oreg.

[21] Appl. No.: 901,357

[22] Filed: Jun. 19, 1992

[51] Int. Cl.⁵ ................ H03K 19/21; G11C 11/34
[52] U.S. Cl. ................ 365/185; 365/189.08; 365/63; 365/900; 257/250; 257/314; 257/316; 257/320
[58] Field of Search ............. 365/185, 900, 189.08, 365/63; 257/250, 314, 316, 319, 320

[56] References Cited

U.S. PATENT DOCUMENTS

| | | |
|---|---|---|
| 3,952,325 | 4/1976 | Beale et al. |
| 4,924,278 | 5/1990 | Logie |
| 4,956,564 | 9/1990 | Holler et al. ............ 365/185 |
| 5,099,451 | 3/1992 | Sourgen et al. ......... 365/185 |
| 5,105,386 | 4/1992 | Andoh et al. ........... 365/185 |

FOREIGN PATENT DOCUMENTS 60-37778  2/1985  Japan.

OTHER PUBLICATIONS

H. Kume, et al, "A 1.28 μm² Contactless Memory Cell Technology for a 3V-Only 64Mbit EEPROM", *IEDM* 1992 991–993 pp. 24.7.1 to 24.7.3.

*Primary Examiner*—Viet Q. Nguyen
*Attorney, Agent, or Firm*—Skjerven, Morrill, MacPherson, Franklin & Friel

[57] ABSTRACT

In embodiments of flash E²PROM arrays, an access transistor is included in each cell thereof, in series with the floating transistor of the cell, the access transistor being used to avoid the problem of drain disturbance in cells other than the cell being programmed. The connection of the control gates in certain of these arrays is such that gate disturbance on the floating gate transistors in those cells not being programmed is reduced or eliminated.

5 Claims, 4 Drawing Sheets

FLASH E²PROM ARRAY WITH MINGLE POLYSILICON LAYER MEMORY CELL

FIELD OF THE INVENTION

This invention relates to memory arrays, and more particularly to flash E²PROM arrays.

BACKGROUND OF THE INVENTION

FIG. 1 shows a typical flash E²PROM cell 10 of the prior art. The cell 10 is made up of a transistor 11 having a substrate 12 of, for example, P type conductivity, with a source 14 and a drain 16 of N type conductivity along a surface of a substrate, the source 14 and drain 16 defining therebetween a channel region 18 along the surface of the substrate 12. Overlying the channel region 18 is an oxide layer 20 on which is disposed a first polysilicon layer 22. The polysilicon layer 22 has disposed thereon an oxide layer 24, which in turn has disposed thereon a second polysilicon layer 26. The polysilicon layer 22 is the floating gate of the device 10, while the polysilicon layer 26 is the control gate thereof.

As is well known, the threshold voltage of the transistor 11 can be changed by addition of electrons to the floating gate 22, or removal of electrons therefrom. In adding electrons to the floating gate 22 (programming the cell), typical of a flash E²PROM cell, the control gate 26 and drain 16 are held at a high positive voltage, while the source 14 is held at ground, the voltage being sufficient to bring the transistor 11 into an avalanche condition, so that hot electrons pass through the oxide 20 into the floating gate 22. For removal of electrons from the floating gate 22 (erasing the cell), again typical of a flash E²PROM cell, a high positive voltage is applied to the source 14, while the control gate 26 is held at ground, so that electrons are drawn from the floating gate 22 through the oxide 20 to the source 14.

A schematic representation of such a prior art E²PROM memory cell is shown in FIG. 2. As noted therein, the bit line BL is connected to the drain 14 of the transistor 10, while the word line WL is connected to the control gate 26.

A prior art array 31 of cells of the type shown in FIGS. 1 and 2 is shown in FIG. 3. The array of FIG. 3 includes for illustrative purposes four such cells 32, 34, 36, 38, each cell including a single transistor as described above. A first bit line BL1 is connected to the drain 14A, 14B of each transistor 11A, 11B in a first column of cells 32, 34, while the source 16A, 16B of each such transistors 11A, 11B is connected to ground. A second bit line BL2 is connected to the drain 14C, 14D of each transistor 11C, 11D in a second column of cells 36, 38, with the source 16C, 16D of each such transistor connected to ground.

The control gates 26A, 26C of the transistors 11A, 11C in a first row of cells 36, 38 are connected to a first word line WL1, while the control gates 26B, 26D of the transistors 11B, 11D in a second row of cells 34, 38 are connected to a second word line WL2.

In programming an individual cell, for example the cell 32, a high positive voltage is applied to word line WL1, while bit line BL1 is also held high and the source 16A is held low, the voltages being sufficiently high to bring the transistor 11A into an avalanche condition, so that hot electrons will travel through the oxide 20 to the floating gate 22A thereof. Meanwhile bit line BL2 and word line WL2 are held low, as are the sources of transistors 11B, 11D.

In such programming, with the bit line BL1 held high, the non-selected cell 34 on the selected bit line, i.e., the transistor 11B, will see a high voltage at the drain 14B thereof, with the source 16B and the word line WL2 low. In order to avoid leakage of the transistor 11B, such a transistor would have to have a very high threshold and/or a very long channel, both of which are detrimental to performance of the device and packing density thereof. If such leakage does occur, it is possible that hot electrons can flow to the floating gate 22B thereof, undesirably changing the threshold voltage of the transistor 11B (called "drain disturbance").

Furthermore, again in regard to, for example, the programming of cell 32, with all high and low conditions as set forth above, with word line WL1 high, even with bit line BL2 low it is possible that electrons will be drawn from the source 14C or drain 16C of the transistor 11C, into the floating gate, undesirably changing the threshold voltage of transistor 11C (called "gate disturbance").

SUMMARY OF THE INVENTION

The present memory array includes a plurality of cells, each including a floating gate transistor and an access transistor in series. In one embodiment all control gates of the floating gate transistors are connected. In another embodiment only the control gates of the floating gate transistors in columns of cells are connected, while in yet another embodiment, only the control gates of the floating gate transistors in rows of cells are connected.

DESCRIPTION OF THE PREFERRED EMBODIMENTS

Figure 4:
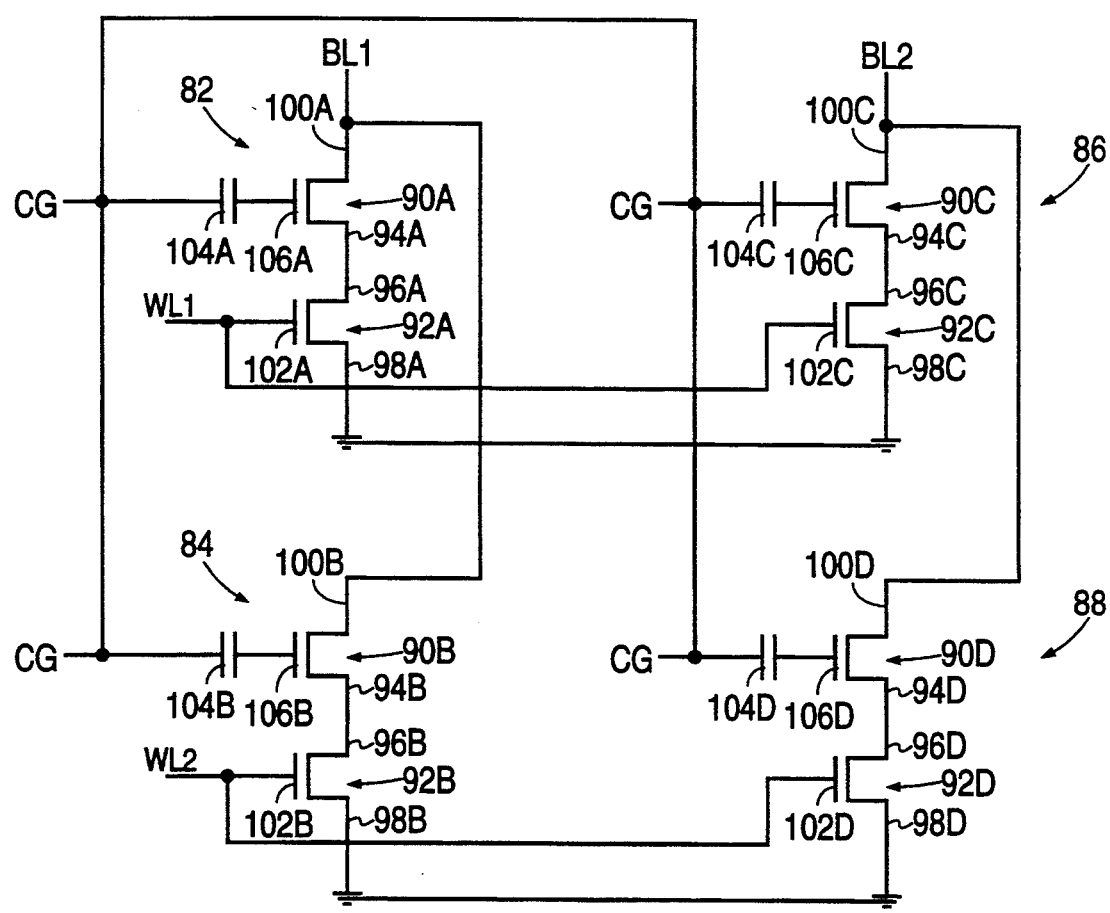
FIG. 4 is a schematic view of a first embodiment of array which is the subject hereof.

With reference to FIG. 4, an array 80 of the present invention is shown. The array 80 includes cells 82, 84, 86, 88, each cell including a floating gate transistor 90 and an access transistor 92, as described as the subject matter in my copending application Ser. No. 07/901,351, filed Jun. 19, 1992, entitled SINGLE POLYSILICON LAYER FLASH E²PROM CELL, invented by Patrick Wang, commonly owned with this application carrying Attorney Docket No. M-2102 US, and herein incorporated by reference. The source 94 of each such transistor 90 is connected to the drain 96 of its associated transistor 92, the source 98 of which is in turn connected to virtual ground. Bit line BL1 is connected to the drain 100A, 100B of each transistor 90A, 90B in a first column of cells 82, 84, while bit line BL2 is connected to the drain 100C, 100D of each transistor 90C, 90D in a second column of cells 86, 88.

The word line WL1 is connected to the gate 102A, 102C of each transistor 90A, 90C in a first row of cells 82, 86, while the word line WL2 is connected to the gate 102B, 102D of each transistor 90A, 90D in a second row of cells 84, 88. The control gates 104A, 104B, 104C, 104D are connected to each other as shown.

A cell is programmed by placing the included floating gate transistor in avalanche condition. For example, this is done in cell 82 by having bit line BL1 high, control gate 104A high, and word line WL1 high. Meanwhile, bit line BL2 is held low, as is word line WL2. During such avalanche condition, hot electrons pass from the channel of the transistor 90A through the gate oxide to the floating gate 106A thereof.

In order to erase all cells 82, 84, 86, 88 of the array 80, the virtual ground lines connected to the source 98A, 98B, 98C, 98D are held high, word lines WL1, WL2 are held high, and the control gates 104A, 104B, 104C, 104D are held low, so that electrons will flow from the floating gate 106A, 106B, 106C, 106D of each transistor 90A, 90B, 90C, 90D to the source 94A, 94B, 94C, 94D thereof.

Figure 3:
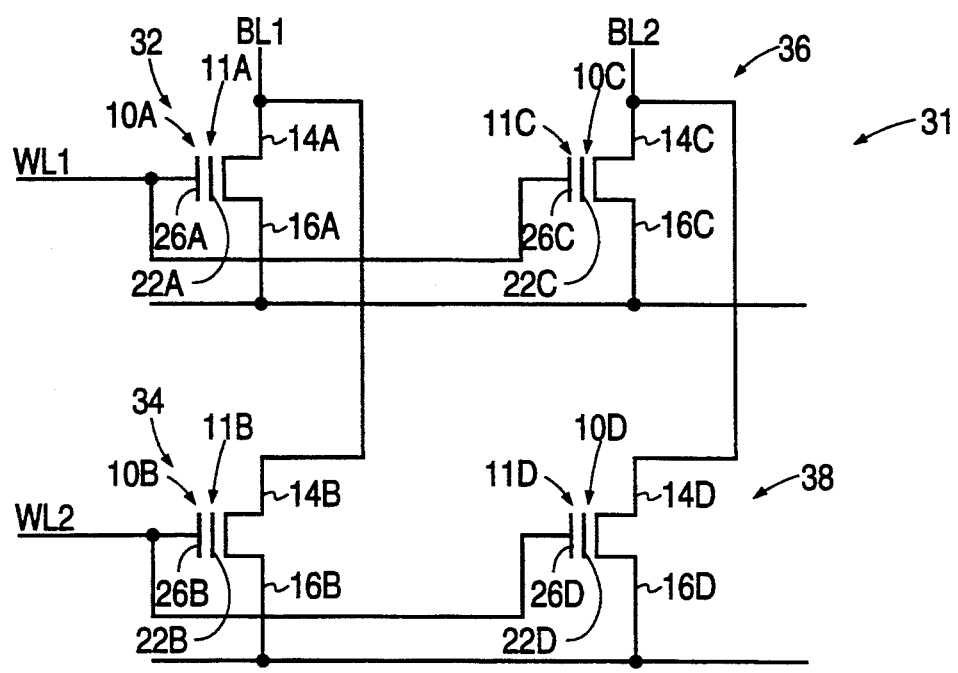
FIG. 3 is a schematic view of an array of cells of FIGS. 1 and 2.

It will be remembered that in the prior art array of FIG. 3, this condition would cause drain distribution on the transistor 11B, because with bit line BL1 high, the drain 14B of transistor 11B is high, which may cause leakage in transistor 11B. The condition of undesirably changing the threshold voltage of transistor 90B in the array 80 of FIG. 4 is avoided, even with the control gate 104B thereof high, because of the inclusion of the transistor 92B in series with transistor 90B, so that will word line WL2 low, transistor 92B is off so that no current can pass through transistor 90B, even with the control gate 104B and drain 94B thereof high.

Figure 5:
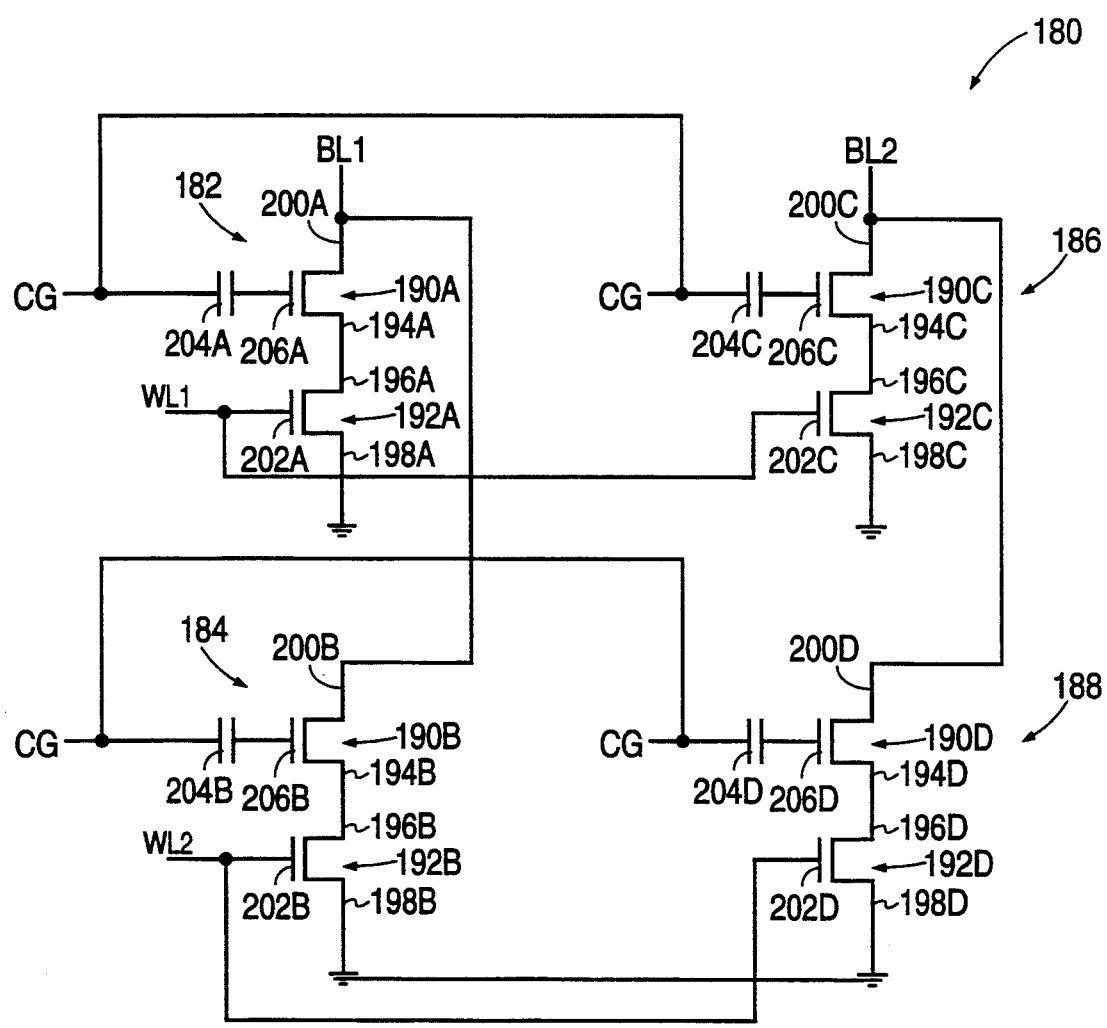
FIG. 5 is a schematic view of a second embodiment of array which is the subject hereof.

While the embodiment of FIG. 4 has significant advantages over the prior art, FIG. 5 shows a variation of the FIG. 4 array, providing additional unique features.

As will be noted, the array 100 of FIG. 5 is in many ways the same as that of FIG. 4, but with a difference in the connection of the control gates, and thus for the sake of clarity, element numbers of FIG. 5 correspond to those of FIG. 4, but with the numbers of FIG. 5 higher by 100 than in FIG. 4.

As noted in FIG. 5, the control gates 204A, 204C of the transistors 190A, 190C in the row of cells 182, 184 are connected, and the control gates 204B, 204D of the transistors 190B, 190D in the row of cells 186, 188 are connected, but control gates of the transistors in either column of cells (i.e., the column containing cells 182, 184, and the column containing cells 186, 188) are not connected.

In the embodiment of FIG. 4, because all the control gates are connected together, during the programming of, for example, the cell 82, with the control gate 104A thereof held high, all the other control gates 104B, 104C, 104D are in a high state. This can create a situation wherein, with either the source or drain of any other floating gate transistor 90B, 90C, 90D in the array 80 being low at that time, electrons could be pulled from that low-state source or drain to the floating gate, changing the threshold voltage of that transistor ("gate disturbance"). For example, with bit line BL2 held low, and word line WL2 held low, both these transistors 90C, 90D are in such a condition.

By using the connections of control gates as in FIG. 5, when programming, for example, the cell 182, only the control gates 204A and 204C are held high, avoiding problems of this type with transistors 190B, 190D, and thus reducing the problem of gate disturbance in the array.

Figure 6:
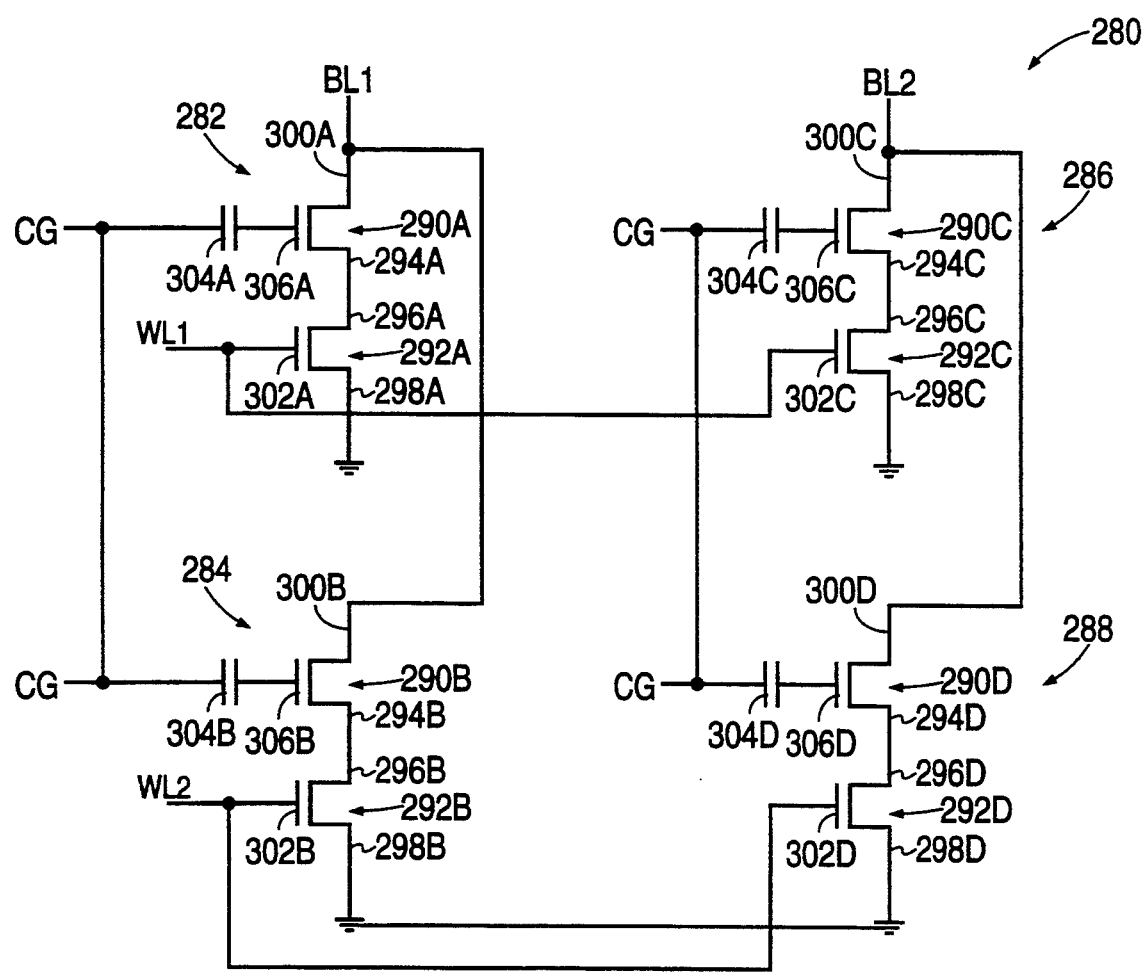
FIG. 6 is a schematic view of a third embodiment of array which is the subject hereof.

Reference is made to FIG. 6 for another embodiment of array 280, which is similar to the arrays of FIGS. 4 and 5, and thus numbers indicating like elements are used, but again with the numbers increased by 100 over FIG. 5. In this case, the difference between the present array 280 and the previously described arrays is that the control gates 304A, 304B of the transistors 290A, 290B in the column of cells 282, 284 are connected, and the control gates 304C, 304D of the transistors 290C, 290D in the column of cells 286, 288 are connected, but the control gates of the transistors in either row of cells 282, 286 or 284, 288 are not connected.

In the programming of, for example, cell 282, the control gate 304A is held high, as is the control gate 304B, with bit line BL1 high and word line WL2 low. It will be seen that in this condition, the drain 300B and source 294B of the transistor 290B are both high, so that we do not have a condition in the transistor 290B wherein either the drain or source thereof is low with the control gate high. Thus, the problem of gate disturbance in regard to transistor 290B is avoided. Of course, with the control gates of the transistors 290C, 290D held low, no such problem occurs in those transistors.

Meanwhile, the problem of drain disturbance is avoided as in the present arrays, due to the inclusion in each cell of a second transistor in series with the floating gate transistor thereof.

I claim:

1. A flash E$^2$PROM cell array comprising a plurality of flash E$^2$PROM cells arranged in columns and rows, each cell having only a single polysilicon layer and comprising a first transistor having a drain, a source, a floating gate and a control gate, the threshold voltage of such first transistor being changeable by adding hot electrons to the floating gate thereof, and a second transistor having a drain, a source, and a gate, the source of the first transistor being connected to the drain of the second transistor;

a plurality of bit lines, each bit line connected to the drain of each first transistor of each cell in a column of cells;

a plurality of word lines, each word line connected to the gate of each second transistor in each cell in a row of cells;

the control gates of each of the first transistors of each cell in a row of cells being connected.

2. The flash E$^2$PROM cell array of claim 1 wherein the control gates of each of the first transistors of each cell in a column of cells are not connected.

3. A flash E$^2$PROM cell array comprising a plurality of flash E$^2$PROM cells arranged in columns and rows, each cell comprising a first transistor having a drain, a source, a floating gate and a control gate, the threshold voltage of such first transistor being changeable by adding hot electrons to the floating gate thereof, and a second transistor having a drain, a source, and a gate, the source of the first transistor being connected to the drain of the second transistor;

a plurality of bit lines, each bit line connected to the drain of each of the first transistors of each cell in a column of cells;

a plurality of word lines, each word line connected to the gate of each of the second transistors in each cell in a row of cells;

the control gates of each of the first transistors of, each cell in a column of cells being connected.

4. The flash E$^2$PROM cell array of claim 3 wherein the control gates of each of the first transistors of each cell in a row of cells are not connected.

5. The flash E$^2$PROM cell array of claim 3 wherein the control gates of each of the first transistors of each cell in a row of cells are connected.

* * * * *

UNITED STATES PATENT AND TRADEMARK OFFICE
CERTIFICATE OF CORRECTION

PATENT NO. : 5,359,573
DATED : October 25, 1994
INVENTOR(S) : Patrick C. Wang

It is certified that error appears in the above-indentified patent and that said Letters Patent is hereby corrected as shown below:

On cover page, item [54], change title to read --"FLASH E$^2$PROM ARRAY WITH SINGLE POLYSILICON LAYER MEMORY CELL"--

Signed and Sealed this

Eleventh Day of April, 1995

Attest:

BRUCE LEHMAN

*Attesting Officer*        *Commissioner of Patents and Trademarks*

UNITED STATES PATENT AND TRADEMARK OFFICE
CERTIFICATE OF CORRECTION

PATENT NO. : 5,359,573
DATED : October 25, 1994
INVENTOR(S) : Patrick C. Wang

Figure 1:
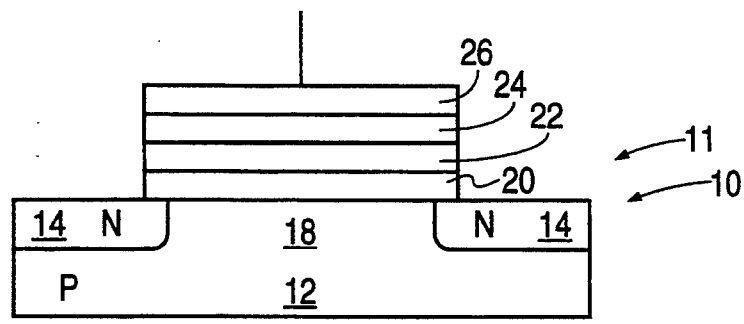
FIG. 1 shows a cross-sectional view of a prior art flash E²PROM cell.
Figure 2:
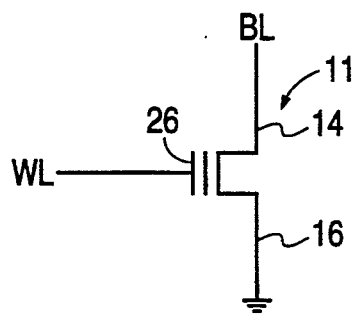
FIG. 2 is a schematic view of the cell of FIG. 1.

It is certified that error appears in the above-indentified patent and that said Letters Patent is hereby corrected as shown below:

In the Drawings
On Sheet 1 of 4, Fig. 1 (Prior Art), change "N 14" to --N 16--.

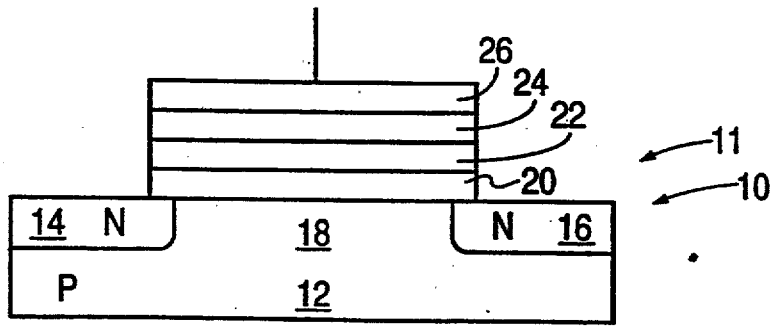

FIG. 1
(PRIOR ART)

Signed and Sealed this

Fourth Day of July, 1995

Attest:

BRUCE LEHMAN

Attesting Officer

Commissioner of Patents and Trademarks